United States Patent
Komine et al.

(10) Patent No.: US 6,835,683 B2
(45) Date of Patent: Dec. 28, 2004

(54) QUARTZ GLASS MEMBER AND PROJECTION ALIGNER

(75) Inventors: Norio Komine, Sagamihara (JP); Akiko Yoshida, Yamato (JP); Hiroki Jinbo, Yokohama (JP); Seishi Fujiwara, Sagamihara (JP)

(73) Assignee: Nikon Corporation, Tokyo (JP)

( * ) Notice: Subject to any disclaimer, the term of this patent is extended or adjusted under 35 U.S.C. 154(b) by 204 days.

(21) Appl. No.: 10/311,233

(22) PCT Filed: Apr. 19, 2002

(86) PCT No.: PCT/JP02/03951

§ 371 (c)(1),
(2), (4) Date: Dec. 17, 2002

(87) PCT Pub. No.: WO02/085808

PCT Pub. Date: Oct. 31, 2002

(65) Prior Publication Data

US 2003/0171203 A1 Sep. 11, 2003

(30) Foreign Application Priority Data

Apr. 19, 2001 (JP) ........................................ 2001-121811
Apr. 19, 2001 (JP) ........................................ 2001-121812

(51) Int. Cl.[7] ................................................ C03C 3/06
(52) U.S. Cl. .......................... 501/54; 423/336; 359/355; 359/642
(58) Field of Search ........................... 501/54; 423/336; 359/355, 642

(56) References Cited

U.S. PATENT DOCUMENTS 5,702,495 A   12/1997   Hiraiwa et al.
6,174,830 B1   1/2001   Jinbo et al.
6,656,860 B2 *  12/2003   Yoshida et al. ............... 501/54
2002/0082157 A1   6/2002   Yoshida et al.

FOREIGN PATENT DOCUMENTS

| JP | A 7-63680 | 3/1995 |
| JP | A 8-295521 | 11/1996 |
| JP | A 10-53432 | 2/1998 |
| JP | A 10-152330 | 6/1998 |
| JP | A 11-211613 | 8/1999 |
| JP | A 11-292551 | 10/1999 |
| JP | 2000-095535 | 4/2000 |
| JP | A 2001-89182 | 4/2001 |

* cited by examiner

Primary Examiner—Elizabeth D. Wood
(74) Attorney, Agent, or Firm—Oliff & Berridge, PLC (57) ABSTRACT

A silica glass member of the present invention is one wherein when a composition thereof is expressed by $SiO_x$, x is not less than 1.85 nor more than 1.95, wherein a concentration of hydrogen molecules included therein is not less than $1 \times 10^{16}$ molecules/cm$^3$ nor more than $5 \times 10^{18}$ molecules/cm$^3$, and wherein a difference A−B between an absorption coefficient A immediately before an end of irradiation with $1 \times 10^4$ pulses of ArF excimer laser light in an average one-pulse energy density of 2 mJ/cm$^2$ and a second absorption coefficient B at 600 seconds after a stop of the irradiation with the ArF excimer laser light is not more than 0.002 cm$^{-1}$. When this silica glass member is applied to an illumination optical system and/or a projection optical system in projection exposure apparatus, it becomes feasible to implement uniform exposure while reducing variation in illuminance on a reticle surface and in an exposure area on a wafer.

7 Claims, 7 Drawing Sheets

QUARTZ GLASS MEMBER AND PROJECTION ALIGNER

TECHNICAL FIELD

The present invention relates to a silica glass member and projection exposure apparatus. More particularly, the present invention relates to a silica glass member used for optically transparent, optical members such as lenses, prisms, plates, etc. in optical systems of apparatus utilizing a light source emitting ultraviolet light, e.g., an ArF excimer laser or the like, for example, such as projection exposure apparatus, CVD apparatus, laser beam machines, etc., and projection exposure apparatus using the silica glass member.

The silica glass member stated in the present invention embraces optical members (final products) such as lenses, prisms, mirrors, plates, etc. used in the optical systems and also embraces silica glass ingots and members partly cut out thereof (half finished products (materials) for fabrication of the optical members).

BACKGROUND ART

The exposure apparatus called a stepper is used in the photolithography technology of exposing and transcribing micropatterns of integrated circuits on a wafer of silicon or the like. The optical system of this stepper is comprised of an illumination optical system for uniformly illuminating a reticle with an integrated circuit pattern thereon, with light from a light source, and a projection optical system for projecting and transcribing the integrated circuit pattern of the reticle at a predetermined reduction ratio (e.g., 1/5) on the wafer.

With recent increase in the degree of integration of LSI, the light sources of the exposure apparatus such as the steppers and the like are proceeding toward shorter wavelengths, from the g-line (436 nm) to the i-line (365 nm) and further to KrF (248.3 nm) and ArF (193.4 nm) excimer lasers. In the case of an example of DRAM among VLSI, as the capacity increased in the order of 1 K, 256 K, 1 M, 4 M, 16 M, 64 M, and 256 M with development from LSI to VLSI, the work line width decreased in the order of 10 $\mu$m, 2 $\mu$m, 1 $\mu$m, 0.8 $\mu$m, 0.5 $\mu$m, 0.3 $\mu$m, and 0.2 $\mu$m, and there are increasing demands for the exposure apparatus capable of implementing exposure in smaller minimum work line width. The light source in this case must be one emitting the ultraviolet light or vacuum ultraviolet light under 250 nm, such as the excimer lasers and the like.

In general, optical glasses used for the lens members of the illumination optical system or the projection optical system in the steppers using the light source of a longer wavelength than the i-line, quickly decrease their optical transmittance in the wavelength region shorter than the i-line and most of the optical glasses transmit no light, particularly, in the wavelength region under 250 nm. For this reason, materials that can be used for the optical systems of the steppers with the excimer laser as a light source are limited to silica glass and some crystal materials. Among others, the silica glass is a material that is commonly used in the ordinary optical systems of ultraviolet and vacuum ultraviolet light as well as the excimer laser steppers.

For implementing exposure of the integrated circuit pattern in large area and high resolution in the projection exposure apparatus, a silica glass optical member used in its optical system is required to have high quality. For example, even a very large aperture member approximately 250 mm in diameter is required to have such homogeneity of refractive index distribution that the difference between maximum and minimum of index distribution of the member is of $10^{-6}$ or less order. For improvement in the resolution of the optical system, it is also important to decrease birefringence, i.e., to decrease internal strain of the optical member, as well as the improvement in the homogeneity of refractive index distribution.

Furthermore, the optical member needs to demonstrate distinctly excellent transmittance, while exhibiting the high quality in the homogeneity of index distribution and the strain as described above. For example, the illumination optical system or the projection optical system of the exposure apparatus needs to be constructed of a considerably large number of lenses and others for correction for aberration, so that the total path length of the entire optical system can be even 1000 mm or more. For keeping the throughput of the optical system, the optical members in use are desired to have the absorption coefficient of not more than 0.003 cm$^{-1}$. Furthermore, each optical member needs to maintain such high transmittance, not only in the central area of the member, but throughout the entire region. For this reason, among the silica glasses solely, only a limited number of silica glasses can be applied to the accurate optical systems such as the excimer laser steppers and the like.

Among the silica glasses, a synthetic silica glass made by a production process called a vapor phase synthesis process is obtained in high purity with a small amount of metal impurities, thus has high transmittance in the ultraviolet region of wavelengths under 250 nm, and further permits a homogeneous silica glass optical member to be formed in large aperture. For this reason, the synthetic silica glass is expected as a promising material for the optical systems of the exposure apparatus such as the excimer laser steppers and the like.

DISCLOSURE OF THE INVENTION

However, even if the exposure apparatus with the light source of the ArF excimer laser or the like was constructed of the lenses and others made of the synthetic silica glass with the excellent characteristics as described above, there occurred variation in illuminance in the exposure area on the wafer and there arose the problem that it was very difficult to implement uniform exposure.

The present invention has been accomplished in view of the problem in the prior art and an object of the present invention is to provide a silica glass member adapted to exposure with ultraviolet light so that it can prevent the absorption of the ultraviolet light and the occurrence of the illuminance variation in the exposure area and implement high-resolution and uniform exposure.

Another object of the present invention is to provide a projection exposure apparatus capable of implementing high-resolution and uniform exposure while preventing the absorption of ultraviolet light in the optical system and reducing the illuminance variation on the reticle surface and in the exposure area on the wafer.

In order to solve the above problem, a silica glass member of the present invention is one wherein when a composition thereof is expressed by SiO$_x$, x is not less than 1.85 nor more than 1.95, wherein a concentration of hydrogen molecules included therein is not less than $1\times10^{16}$ molecules/cm$^3$ nor more than $5\times10^{18}$ molecules/cm$^3$, and wherein a difference A−B between an absorption coefficient A immediately before an end of irradiation with $1\times10^4$ pulses of ArF excimer laser light in an average one-pulse energy density of 2 mJ/cm² and a second absorption coefficient B at 600 seconds after a stop of the irradiation with the ArF excimer laser light is not more than 0.002 cm$^{-1}$.

A projection exposure apparatus of the present invention is one comprising a reticle having a pattern; an illumination optical system for illuminating the reticle with light of a predetermined wavelength; and a projection optical system for focusing the pattern on the reticle illuminated by the illumination optical system, on a wafer, wherein at least either the illumination optical system or the projection optical system comprises a silica glass member wherein when a composition thereof is expressed by SiO$_x$, x is not less than 1.85 nor more than 1.95, wherein a concentration of hydrogen molecules included therein is not less than 1×10$^{16}$ molecules/cm³ nor more than 5×10$^{18}$ molecules/cm³, and wherein a difference A−B between an absorption coefficient A immediately before an end of irradiation with 1×10$^4$ pulses of ArF excimer laser light in an average one-pulse energy density of 2 mJ/cm² and a second absorption coefficient B at ten minutes after a stop of the irradiation with the ArF excimer laser light is not more than 0.002 cm$^{-1}$.

According to the present invention, when the composition, the hydrogen molecule concentration, and the absorption coefficients of the silica glass member satisfy the above specific conditions, the absorption amount is sufficiently decreased, particularly, in low dose regions and variation of absorption coefficient is well restrained in repetitions of ultraviolet irradiation on and irradiation off; it thus becomes feasible to prevent the absorption of ultraviolet light in the silica glass member and the illuminance variation in the exposure area. Accordingly, it becomes feasible to implement high-resolution and uniform exposure when the silica glass member of the present invention is applied to the illumination optical system and/or the projection optical system in the projection exposure apparatus.

In the silica glass member of the present invention, preferably, the absorption coefficient A and the absorption coefficient B satisfy a condition represented by A/B<2.

In the silica glass member of the present invention, preferably, an absorption coefficient at a predetermined wavelength in a wavelength region of 190 to 400 nm before the irradiation with the ArF excimer laser light is not more than 0.003 cm$^{-1}$.

Furthermore, in the silica glass member of the present invention, preferably, in a radial distribution of birefringences a difference between a maximum and a minimum of the birefringences is not more than 2.0 nm/cm.

Furthermore, in the silica glass member of the present invention, preferably, a hydroxyl concentration is not less than 800 ppm nor more than 1300 ppm and in a radial distribution of hydroxyl concentrations a difference between a maximum and a minimum of the hydroxyl concentrations is not more than 50 ppm.

Furthermore, in the silica glass member of the present invention, preferably, a content of Na is not more than 20 ppb.

BEST MODE FOR CARRYING OUT THE INVENTION

In the silica glass member of the present invention, where the composition thereof is expressed by SiO$_x$, x needs to be not less than 1.85 nor more than 1.95 and is preferably not less than 1.90 nor more than 1.95. When x falls within the foregoing range, the absorption amount can be satisfactorily decreased, particularly, in the low dose regions.

The conventional silica glasses for the excimer steppers are often synthesized under a strong reduction atmosphere in order to let them contain more hydrogen, for the purpose of improvement in durability to the excimer laser, and x in the composition SiO$_x$ thereof tends to be less than 1.85. However, in the case of the synthesis under such a strong reduction atmosphere, it results in producing more oxygen lack defects ≡Si—Si≡ and structural defects ≡Si—H. These defects are precursors of E' centers described previously, and readily produce the E' centers under irradiation with the ArF excimer laser light or the KrF excimer laser light. Therefore, when x is less than 1.85, the silica glass member has the large absorption coefficient during irradiation with ultraviolet light and thus fails to achieve the satisfactory optical characteristics.

On the other hand, when the silica glass is synthesized under an excess oxygen condition, x in the composition SiO$_x$ tends to be a value exceeding 1.95. As the ratio of oxygen atoms increases in this way, peroxy linkages ≡Si—O—O—Si≡ tend to be produced easier in the glass. The peroxy linkages are precursors of peroxy radicals ≡Si—O—O., which are the cause of increase in the absorption coefficient. Accordingly, when x is over 1.95, it is not possible to achieve the satisfactory optical characteristics, either, because of the increase of absorption coefficient.

The concentration of hydrogen molecules included in the silica glass member of the present invention needs to be not less than 1×10$^{16}$ molecules/cm³ nor more than 5×10$^{18}$ molecules/cm³ and is preferably not less than 1×10$^{17}$ molecules/cm³ nor more than 2.5×10$^{18}$ molecules/cm³. When the concentration of hydrogen molecules is less than 1×10$^{16}$ molecules/cm³, the durability against ultraviolet light is insufficient and a drop of transmittance becomes easier to occur during irradiation with ultraviolet light. When the concentration of hydrogen molecules is over 5×10$^{18}$ molecules/cm³, the absorption amount tends to increase in the low dose regions.

In the silica glass member of the present invention, the difference A−B between the absorption coefficient A immediately before the end of irradiation with 1×10$^4$ pulses of the ArF excimer laser light in the average one-pulse energy density of 2 mJ/cm² and the second absorption coefficient B at 600 seconds after the stop of irradiation with the ArF excimer laser light needs to be not more than 0.005 cm$^{-1}$, and is preferably not more than 0.004 cm$^{-1}$, more preferably not more than 0.003 cm$^{-1}$, still more preferably not more than 0.002 cm$^{-1}$, and particularly preferably not more than 0.001 cm$^{-1}$. When A−B is more than 0.005 cm$^{-1}$, the illumination variation becomes easier to occur in the exposure area in repetitions of irradiation on and irradiation off with the ultraviolet pulse laser light and it becomes very hard to implement uniform exposure.

Figure 5:
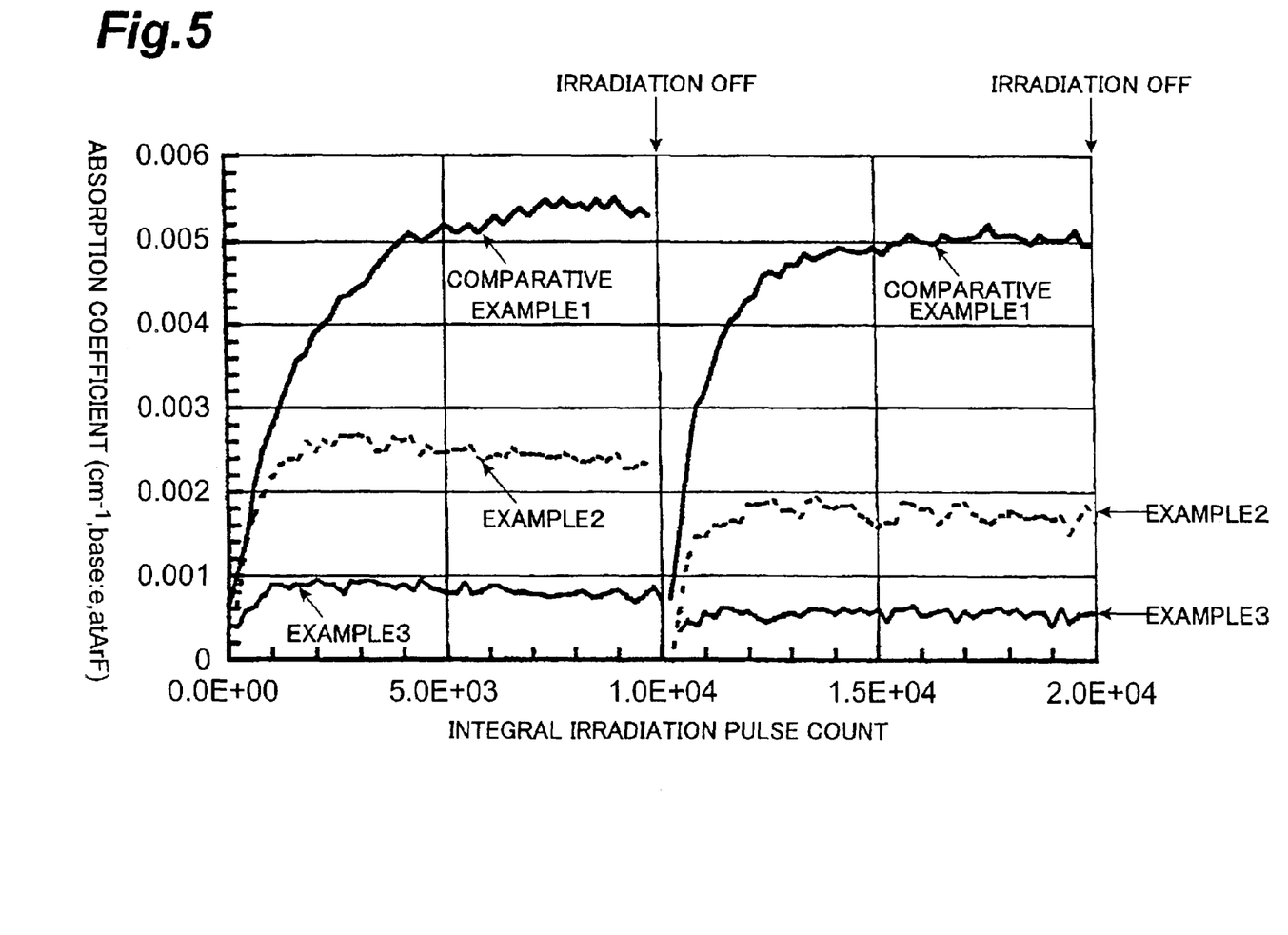
FIG. 5 is a graph showing the absorption coefficients in repetitions of irradiation on and irradiation off with the ArF excimer laser in Examples 2 and 3 and Comparative Example 1.

According to the knowledge of Inventors, the foregoing illuminance variation is considered to be caused by variation in the absorption coefficient of the silica glass which occurs in repetitions of irradiation on and irradiation off with the ultraviolet pulse laser light to the silica glass member. Namely, when consideration is given to the irradiation situation with the ultraviolet pulse laser light to the optical members in the exposure apparatus, irradiation on and off with the ultraviolet pulse laser light are normally repeated in cycles of several seconds to several hundred seconds to the optical members, and the variation of absorption coefficient due to the repetitions increases in the conventional synthetic silica glasses, as indicated by Comparative Example 1 in FIG. 5 which will be detailed later. For this reason, the quantity of light also largely varies with the variation of absorption coefficient, and this conceivably made the illuminance variation easier to occur in the exposure area on the wafer and the uniform exposure very hard. This will be detailed below.

When even the synthetic silica glass is subjected to action of high-power ultraviolet light or excimer laser light, there appear a 215 nm absorption band originating in structural defects called the E' centers (having the structure of ≡Si., where ≡ does not represent a triple bond but represents three single bonds each of which bonds to an oxygen atom, and . represents an unpaired electron) and a 260 nm absorption band originating in structural defects called NBOHC (Non-Bridging Oxygen Hole Center, which has the structure of ≡Si—O.), and the transmittance is heavily lowered in the ultraviolet region; therefore, there were some synthetic silica glasses inappropriate for the materials of optical lenses for ultraviolet light as described previously. Particularly, the 215 nm absorption band can appear great even in the case where the dose [=(irradiation energy density)×(irradiation time or the number of irradiation pulses)] is small. This absorption band is relaxed by hydrogen molecules included in the silica glass and the absorption coefficient quickly drops after the stop of ultraviolet irradiation. Such increase and decrease of absorption coefficient appear with a certain time constant.

When consideration is given herein to the ultraviolet irradiation behavior to the optical elements in the exposure apparatus, irradiation on and off with ultraviolet light are normally repeated in cycles of several seconds to several hundred seconds. This means that the irradiation in low dose is repeated at certain irradiation intervals. In this case, if there occurs the absorption as described above, increase and decrease of absorption coefficient will be repeated during irradiation on periods and during irradiation off periods. Since the width of this variation is large, the occurrence of the absorption band has some time constant and there thus occurs the phenomenon that the time of change in the light quantity on the wafer becomes long, i.e., unevenness of the light quantity on the wafer becomes large, which results in failing to achieve satisfactory resolution.

The above described the projection exposure apparatus as an example of the apparatus having the conventional synthetic silica glass members, but the above is also the case in the other apparatus having the synthetic silica glass members, in that the variation of absorption coefficient of silica glass in repetitions of irradiation on and irradiation off with the ultraviolet pulse laser light to the synthetic silica glass members results in degradation of the optical characteristics of the apparatus.

In the silica glass member of the present invention, the ratio A/B of the absorption coefficient A to the absorption coefficient B is preferably A/B<2, more preferably A/B<1.8, still more preferably A/B<1.5, and particularly preferably A/B<1.3. When A/B satisfies the above conditions, it is feasible to further decrease the variation amount of absorption coefficient in repetitions of irradiation on and irradiation off with ultraviolet light such as the ultraviolet pulse laser light or the like, so that the illuminance variation can be restrained more securely.

In the silica glass member of the present invention, preferably, the absorption coefficient at a predetermined wavelength in the wavelength region of 190 to 400 nm before the irradiation with the ArF excimer laser is not more than 0.003 cm$^{-1}$; for example, when it is applied to the optical system in the projection exposure apparatus, it is feasible to maintain the throughput of the optical system.

Furthermore, in the silica glass member of the present invention, preferably, the difference between the maximum and the minimum in the radial birefringence distribution is within 2.0 nm/cm, because the internal strain decreases and improvement is made in the resolution of the optical system using the member.

In the silica glass member of the present invention, preferably, the hydroxyl concentration is 800–1300 ppm, because improvement is made in the durability against ultraviolet light.

Furthermore, in the silica glass member of the present invention, preferably, the difference between the maximum and the minimum in the radial hydroxyl concentration distribution is not more than 50 ppm, because the birefringence distribution becomes smaller. Inventor et al. discovered that the birefringence distribution of silica glass was largely affected by structural distribution (bond angle distribution of $SiO_2$), impurity distribution, etc. of silica glass. We found that the influence of the hydroxyl concentration distribution was particularly strong and the silica glass was yielded with small birefringence when the difference between the maximum and the minimum in the radial hydroxyl concentration distribution of the silica glass member was not more than 50 ppm.

In the silica glass member of the present invention, preferably, the content of Na is not more than 20 ppb, because the transmittance becomes higher.

In the silica glass member of the present invention, preferably, a chlorine concentration thereof is not more than 0.1 ppm, because it becomes feasible to make improvement in the durability against ultraviolet light (i.e., to achieve decrease in degradation of transmittance even with execution of ultraviolet irradiation over long periods of time) and to decrease the amount of hydrochloric acid discharged from manufacturing equipment. When the direct technique is employed in fabrication of the silica glass of the present invention, the raw material can be selected from silicon fluoride compounds typified by silicon tetrafluoride and organosilicon compounds, which substantially contain no chlorine, whereby no chlorine is included substantially in the resultant silica glass and whereby the chlorine content can be kept not more than 0.1 ppm.

As described previously, the silica glass member of the present invention also embraces the half finished products for fabrication of optical members, as well as the optical members such as lenses and others as final products. It can also be used as a photomask substrate such as a reticle or the like to be incorporated in the optical system.

In fabrication of the silica glass member of the present invention, preferably, the silica glass is synthesized under an adequate reduction atmosphere in consideration of the composition of the silica glass, the hydrogen molecule concentration, and the absorption coefficient. Inventor et al. conducted research to find out the appropriate reduction atmosphere by synthesis experiments and then found that the silica glass was yielded so as to have the foregoing composition and so that the absorption amount in the low dose regions was restrained to the practically trouble-free level, by defining an excess hydrogen region only in the inside region in a combustion gas during the synthesis of the silica glass and setting the ratio close to the stoichiometric ratio in the peripheral region, as described later. A preferred fabrication method for obtaining the silica glass member of the present invention will be described below.

The fabrication method according to the present invention includes a step of effecting flame hydrolysis, using a furnace, a target located in the inside space of the furnace, and a multi-tube burner whose ejection orifice is directed to the target, to deposit and fuse glass microparticles on the target to obtain a silica glass ingot. The burner is one having a source ejection tube located in the central region and adapted to eject a gas containing a silicon compound as a raw material, and a plurality of oxygen and hydrogen ejection tube groups, each group being concentrically arranged around the source ejection tube and adapted to eject oxygen gas and hydrogen gas. For each of the oxygen and hydrogen ejection tube groups except for the outermost oxygen and hydrogen ejection tube group among the plurality of oxygen and hydrogen ejection tube groups, a flow rate ratio of oxygen gas to hydrogen gas from the oxygen and hydrogen ejection tube group is set in the range of not less than 0.29 nor more than 0.4. For the outermost oxygen and hydrogen ejection tube group among the plurality of oxygen and hydrogen ejection tube groups, the flow rate ratio of oxygen gas to hydrogen gas from the oxygen and hydrogen ejection tube group is set in the range from 0.4 to the theoretical equivalence ratio. This makes it feasible to suitably obtain the silica glass member of the present invention wherein the composition, the concentration of hydrogen included therein, and the absorption coefficients satisfy the aforementioned specific conditions.

The theoretical equivalence ratio herein is a ratio of an oxygen gas flow rate to a hydrogen gas flow rate under supply of oxygen and hydrogen in exact proportion in the reaction where the silicon compound as a raw material hydrolyzes with oxygen gas and hydrogen gas to synthesize the silica glass, and is determined based on a chemical formula of hydrolysis. For example, when the raw material is silicon tetrachloride, the theoretical equivalence ratio is 0.5 based on the following chemical formula:

$$SiCl_4 + O_2 + 2H_2 \rightarrow SiO_2 + 4HCl.$$

Preferably, the silica glass member obtained in this way is subjected to such a thermal treatment that it is retained at or above 900° C. for ten or more hours, the temperature is then decreased at the decreasing rate of 10 or less ° C. per hour down to below 500° C., and thereafter it is made to cool.

The resultant silica glass member is also preferably subjected to such a thermal treatment that it is retained at or above 500° C. for 100 or more hours and then it is made to cool.

On the other hand, even in the case of the silica glass being synthesized by the direct technique where the synthesis condition is the conventional hydrogen excess condition, it is also possible to obtain the silica glass of the present invention if the silica glass after completion of the synthesis is subjected to a hydrogen decreasing thermal treatment step of carrying out a thermal treatment so as to decrease the hydrogen molecule concentration. This hydrogen decreasing thermal treatment step may be, for example, a step of performing the thermal treatment of the silica glass synthesized by the direct technique, under the conditions of the retention temperature of 500–900° C. and the retention time of 100–1000 hours in nitrogen gas or in another inert gas or in a reducing gas except for the hydrogen gas or in another gas containing no hydrogen molecule or in vacuum or in a gas of 0.1 or lower atm. This hydrogen decreasing thermal treatment step is effective, particularly, in the case where x in the composition $SiO_x$ is made not less than 1.85 and in the case where the hydrogen molecule concentration is made not more than $1 \times 10^{16}$ molecules/cm$^3$.

Furthermore, when the silica glass subjected to the foregoing hydrogen decreasing thermal treatment, or a silica glass synthesized under the oxygen excess condition is treated by a hydrogen increasing thermal treatment step described later, it is possible to decrease x in the composition $SiO_x$ and increase the hydrogen molecule concentration, without degradation of the characteristics of the silica glass according to the present invention. For example, it can be a step of performing the thermal treatment of the silica glass subjected to the hydrogen decreasing thermal treatment step, under the conditions of the retention temperature of 100–500° C. and the retention time of 100–10000 hours in a gas of 1–10 atm containing hydrogen gas 0.1–100%. This hydrogen increasing thermal treatment step makes it feasible to bring the hydrogen molecule concentration into the range of $5 \times 10^{17}$ to $3 \times 10^{18}$ molecules/cm$^3$, so as to make further improvement in the durability against ultraviolet light. It is also feasible to decrease the absorption coefficient of the silica glass member, by making x not more than 1.95.

A projection exposure apparatus according to the present invention will be described below. The present invention is effective, particularly, in the projection exposure apparatus as called the stepper, for projecting an image of a pattern on a reticle, onto a wafer coated with a photoresist.

Figure 1:
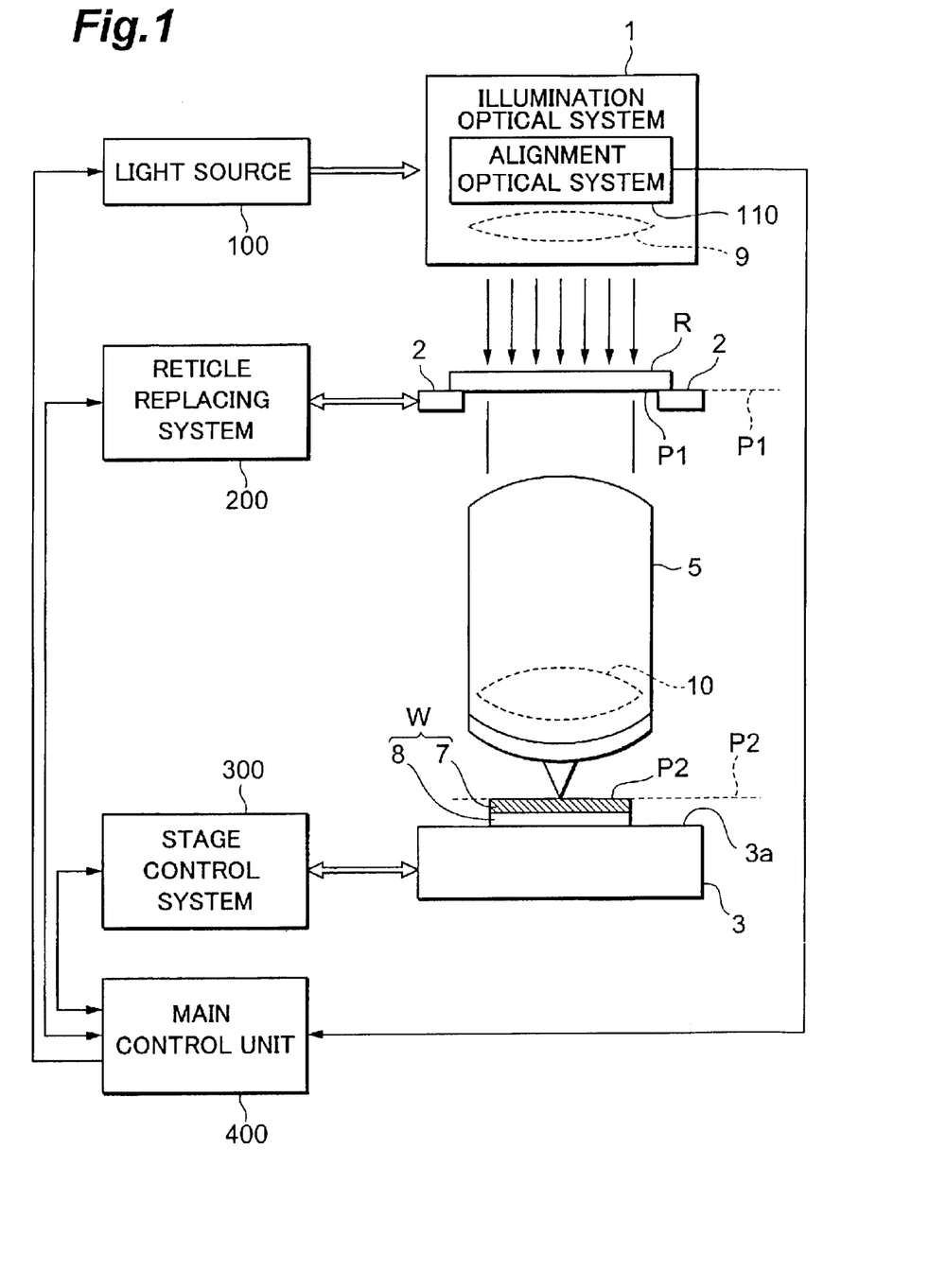
FIG. 1 is a schematic illustration showing a preferred embodiment of the projection exposure apparatus of the present invention.

FIG. 1 is a schematic illustration schematically showing a preferred embodiment of the projection exposure apparatus according to the present invention. The projection exposure apparatus shown in FIG. 1 includes a wafer stage 3 on which a substrate 8 with a photoresist 7 (which will be referred to simply as a "substrate W" in total) to be placed on a surface 3a can be mounted; an illumination optical system 1 for irradiating the vacuum ultraviolet light of the wavelength prepared as exposure light and transcribing a pattern of a mask (reticle R) prepared, onto the substrate W; a light source 100 for supplying the exposure light to the illumination optical system 1; and a projection optical system 5 for projecting the image of the pattern of the mask R onto the substrate W, which is placed between the first surface P1 (object plane) where the mask R is located and the second surface (image plane) matched with the surface of the substrate W. The illumination optical system 1 also includes an alignment optical system 110 for adjusting the relative positions between the mask R and the wafer W, and the mask R is placed on a reticle stage 2 which is movable in parallel to the surface of the wafer stage 3. A reticle replacing system 200 is configured to replace the reticle (mask R) set on the reticle stage 2, with another and carry it. The reticle replacing system 200 includes a stage driver for moving the reticle stage 2 in parallel with the surface 3a of the wafer stage 3. The projection optical system 5 has an alignment optical system applied to the scan type exposure apparatus.

The silica glass member of the present invention (e.g., an optical lens) is used in this exposure apparatus. Specifically, for example, the exposure apparatus shown in FIG. 1 can be provided with an optical lens or optical lenses according to the present invention as either or both of an optical lens 9 of the illumination optical system 1 and an optical lens 10 of the projection optical system 5. Since this exposure apparatus is provided with the silica glass member(s) in which the variation amount of absorption coefficient decreases with repetitions of irradiation on and off with ultraviolet light such as the ultraviolet pulse laser light or the like, the illuminance variation is restrained well in the exposure area on the substrate W, which enables exposure with better uniformity.

Figure 2:
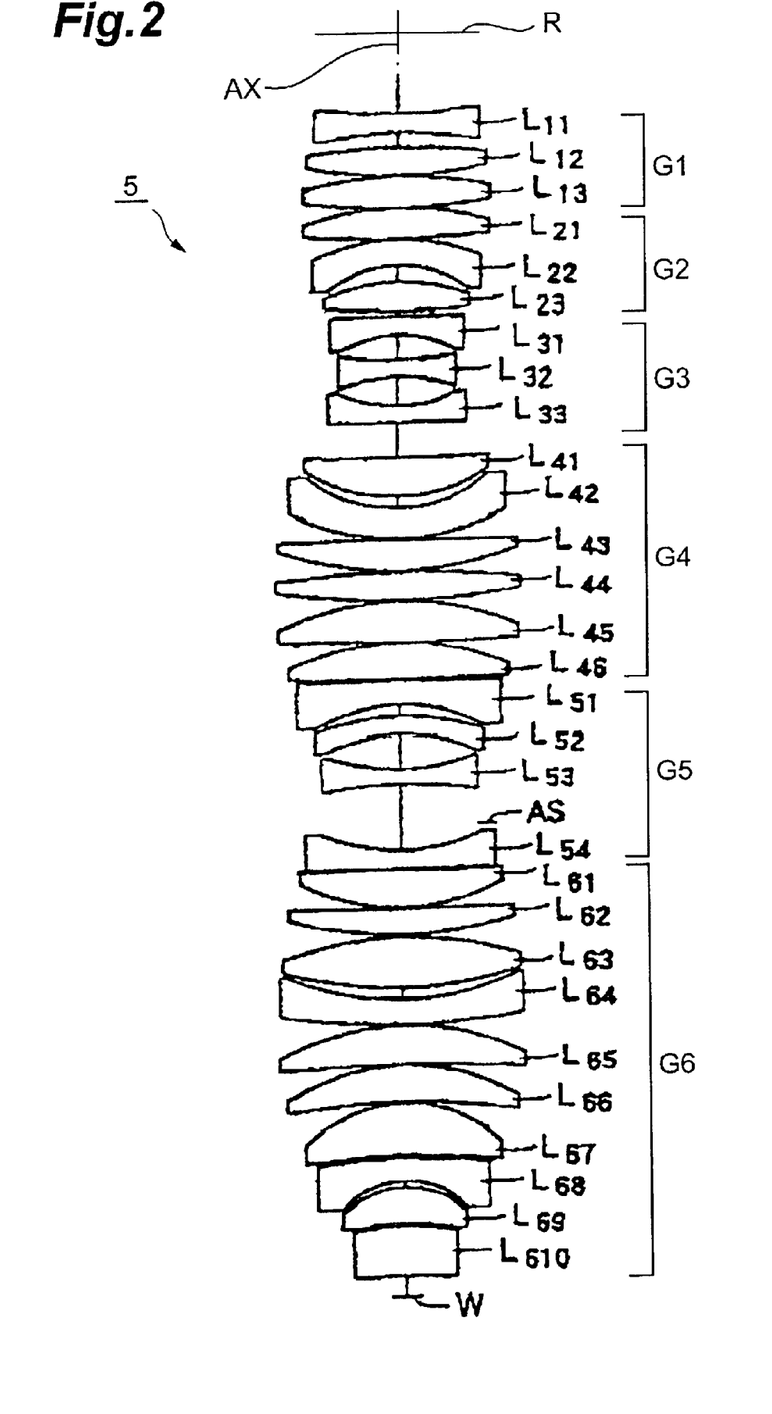
FIG. 2 is a schematic illustration showing an example of the projection optical system according to the present invention.

The projection optical system 5 constructed using the optical member of the present invention will be described below in more detail with reference to FIG. 2. FIG. 2 is a schematic illustration showing a preferred example of the projection optical system 5 according to the present invention. The projection optical system 5 is composed of the following lens units in the order named from the reticle R side as the first object: a first lens unit G1 with a positive power; a second lens unit G2 with a positive power; a third lens unit G3 with a negative power; a fourth lens unit G4 with a positive power; a fifth lens unit G5 with a negative power; and a sixth lens unit G6 with a positive power. The system is nearly telecentric on the object side (the reticle R side) and on the image side (the wafer W side) and has a reduction ratio. This projection optical system has N.A. of 0.6 and the projection ratio of 1/4.

In this projection optical system, $L_{11}$–$L_{44}$, $L_{51}$–$L_{62}$, $L_{64}$, and $L_{68}$–$L_{610}$ are lenses of silica glass, and six lenses $L_{45}$, $L_{46}$, $L_{63}$, $L_{65}$, $L_{66}$, and $L_{67}$ are those of fluoride crystal. In this configuration, the optical path length of lenses consisting of the silica glass members of the present invention is preferably ten or more % (more preferably, 50 or more %) of the total of path lengths of the lenses $L_{11}$–$L_{44}$, $L_{51}$–$L_{62}$, $L_{64}$, and $L_{68}$–$L_{610}$, and it is particularly preferable that all of the lenses $L_{11}$–$L_{44}$, $L_{51}$–$L_{62}$, $L_{64}$, and $L_{68}$–$L_{610}$ be the optical members of the present invention.

EXAMPLES

The present invention will be described below in further detail on the basis of Examples and Comparative Examples, but it is noted that the present invention is by no means intended to be limited to Examples below.

Examples 1–4 and Comparative Examples 1, 2
(Fabrication of Silica Glass Member)

Figure 3:
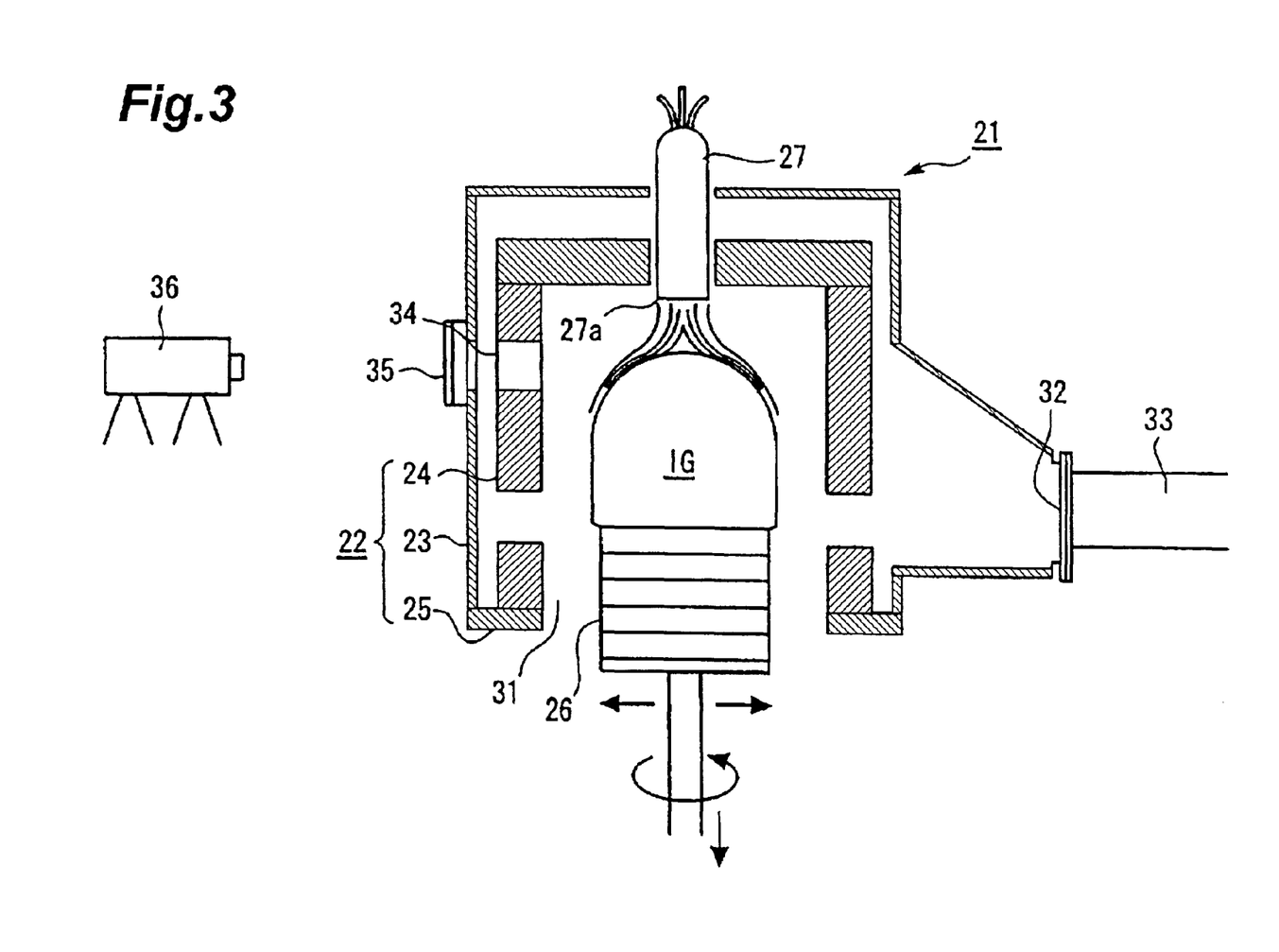
FIG. 3 is a schematic sectional view showing a configuration of a synthetic silica glass fabrication system used in Examples.

In Examples 1–4 and Comparative Examples 1, 2, the synthetic silica glass member was fabricated using the synthetic silica glass fabrication system 21 shown in FIG. 3.

A furnace 22 of the synthetic silica glass fabrication system 21 is constructed of a furnace frame 23, a refractory 24 disposed in this furnace frame 23, and a furnace floorboard 25 on which these are mounted. The refractory 24 is made of alumina 99% pure. The system has a multi-tube burner 27 for synthesis of silica glass, which is installed with an ejection orifice 27a being directed toward a target 26 for formation of an ingot IG inside the refractory 24, and is constructed so as to deposit and vitrify microparticles of silica glass on the target 26. The furnace frame 23 is provided with an exhaust port 32 for discharging the waste gas of HCl and others evolving in the furnace during the synthesis of silica glass, to the outside of the furnace, and an exhaust pipe 33 is connected to the exhaust port 32. An interior monitoring window 34 is further formed for observation of the interior of the furnace from the outside of the furnace. An interior monitoring camera 36 such as a CCD camera or the like is disposed outside the interior monitoring window 34, so as to be able to photograph the interior of the furnace. In the drawing, numeral 35 designates an open/close lid of the window 34.

Figure 4:
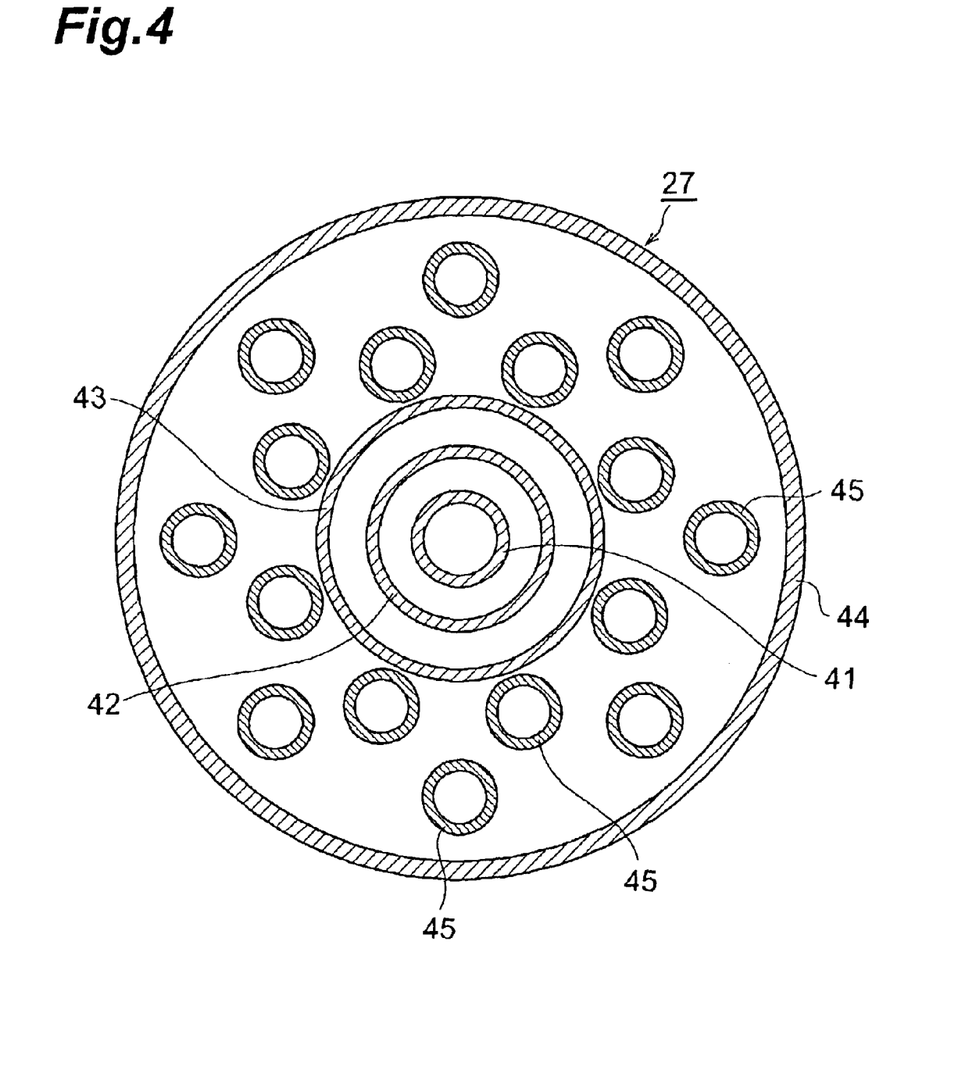
FIG. 4 is an explanatory diagram showing a configuration of a burner used in Examples 1–4 and Comparative Examples 1–3.

FIG. 4 shows a configuration of the silica glass synthesis burner 27 viewed from the ejection orifice side. This burner 27 is provided with a first tube (source ejection tube) 41 placed in the central region and provided for ejecting a source gas and a carrier gas for dilution thereof; a second tube 42 concentrically arranged around the first tube 41; a third tube 43 concentrically arranged around the second tube 42; a fourth tube 44 concentrically arranged around the third tube 43; and a plurality of fifth tubes 45 placed between the outer periphery of the third tube 43 and the inside of the fourth tube 44.

When the source gas was a silicon chloride compound, gases were ejected from the ejection orifice 27a at the distal end of the burner 27 in such a manner that oxygen gas 1 was ejected from between the first tube 41 and the second tube 42, hydrogen gas 1 from between the second tube 42 and the third tube 43, hydrogen gas 2 from between the third tube 43 and the fourth tube 44, and oxygen gas 2 from the plurality of fifth tubes 45. When the source gas was an organosilicon compound, gases were ejected from the ejection orifice 27a at the distal end of the burner 27 in such a manner that hydrogen gas 1 was ejected from between the first tube 41 and the second tube 42, oxygen gas 1 from between the second tube 42 and the third tube 43, hydrogen gas 2 from between the third tube 43 and the fourth tube 44, and oxygen gas 2 from the plurality of fifth tubes 45.

As seen from the above description, in the both cases of the source gas being either of the silicon chloride compound and the organosilicon compound, the second tube 42 and the third tube 43 constitute an oxygen and hydrogen ejection tube group of the first group concentrically arranged around the source ejection tube 41 and configured to eject the oxygen gas 1 and hydrogen gas 1, and the fourth tube 44 and the plurality of fifth tubes 45 constitute an oxygen and hydrogen ejection tube group of the second group concentrically arranged around the source ejection tube 41 and configured to eject the oxygen gas 2 and hydrogen gas 2.

Using this synthetic silica glass fabrication system 21, the oxygen gas and hydrogen gas were ejected from the ejection orifice 27a at the distal end of the burner 27 to be mixed and burnt. At the same time as it, the gas of the silicon chloride compound or the organosilicon compound of high purity (purity of 99.99% or higher) as a raw material, as diluted with a carrier gas (oxygen gas of 1.8 slm in the case of the source gas being the silicon chloride compound, or nitrogen gas of 4 slm in the case of the source gas being the organosilicon compound), was ejected at the flow rate presented in Table 1, from the source ejection tube 41 in the center of the burner 27. This resulted in generating silica glass microparticles (soot) by oxidative reaction in the combustion flame, and the microparticles were deposited on the silica glass target 26 of φ200 mm and simultaneously fused by heat of the flame, so as to synthesize the synthetic silica glass ingot IG in each of Examples 1–4 and Comparative Examples 1, 2. During this operation, the target 26 was rotated at the rate of seven rotations per minute, was swung horizontally within the moving range of 80 mm in the period of 90 seconds, and was pulled down at a constant descent speed (2.4 mm per hour in the case of the raw material being the silicon chloride compound, or 1.6 mm per hour in the case of the raw material being the organosilicon compound).

Table 1 presents a list of synthesis conditions in the fabrication of the silica glass ingots in Examples 1–4 and Comparative Examples 1, 2. Specifically, Table 1 provides the setting conditions for the type of the raw material, the flow rate of the raw material, the ratio of the ejection flow rate of oxygen gas 1 to the ejection flow rate of hydrogen gas 1 (ratio 1=flow rate of oxygen gas 1/flow rate of hydrogen gas 1), and the ratio of the ejection flow rate of oxygen gas 2 to the ejection flow rate of hydrogen gas 2 (ratio 2=flow rate of oxygen gas 2/flow rate of hydrogen gas 2) in the fabrication of the silica glass ingots in Examples 1–4 and Comparative Examples 1,2. The hydrogen gases 1, 2 and the oxygen gases 1, 2 represent the hydrogen gases or the oxygen gases ejected from the respective portions of the ejection orifice 27a of the burner 27 described previously.

As indicated in Table 1, the source gas was silicon tetrachloride ($SiCl_4$) as the silicon chloride compound in Examples 1, 2 and Comparative Example 1, or octamethyl cyclotetrasiloxane [chemical formula: $(Si(CH_3)_2O)_4$, abbreviation: OMCTS] as the organosilicon compound in Examples 3, 4 and Comparative Example 2.

A column-shaped block material 280 mm in diameter and 40 mm in thickness was cut out from the portion located in the radially central region of each silica glass ingot and 100 mm inside from the top surface (ingot head) in Examples 1–4 and Comparative Examples 1, 2.

The thermal treatment conditions for these block materials are presented in Table 1. The block materials in Examples 1, 3, 4 and Comparative Example 2 were subjected to the thermal treatment of retaining each material at the retention temperature of 1000° C. for ten hours, thereafter decreasing the temperature at the rate of 10° C. per hour to 500° C., and then letting the material cool, in the atmosphere in a thermal treatment furnace under the atmospheric pressure. The block material in Example 2 was subjected to the heat treatment of retaining it at the retention temperature of 800° C. for 100 hours, thereafter decreasing the temperature at the rate of 10° C. per hour to 500° C., and then letting it cool, in a nitrogen gas atmosphere in the thermal treatment furnace under the atmospheric pressure. This thermal treatment is a kind of the thermal treatment of retaining the block material at or above 500° C. for 100 or more hours and thereafter letting it cool. On the other hand, the block material in Comparative Example 1 was not subjected to any thermal treatment.

TABLE 1

| | Raw material | Flow rate of raw material [g/ml] | $O_2/H_2$ gas ratios | | Thermal treatment conditions | | |
|---|---|---|---|---|---|---|---|
| | | | Ratio 1 | Ratio 2 | Retention temperature [° C.] | Retention time [hours] | Cooling temperature [° C.] |
| Example 1 | $SiCl_4$ | 30 | 0.29 | 0.44 | 1000 | 10 | 500 |
| Example 2 | $SiCl_4$ | 30 | 0.29 | 0.44 | 800 | 100 | 500 |
| Example 3 | OMCTS | 13.2 | 0.4 | 0.47 | 1000 | 10 | 500 |
| Example 4 | OMCTS | 13.2 | 0.4 | 0.5 | 1000 | 10 | 500 |
| Comparative Example 1 | $SiCl_4$ | 30 | 0.15 | 0.29 | — | — | — |
| Comparative Example 2 | OMCTS | 13.1 | 0.86 | 0.6 | 1000 | 10 | 500 |
| Comparative Example 3 | $SiCl_4$ | 30 | 0.15 | 0.29 | 1000 | 10 | 500 |

(Measurement of Birefringence)

The birefringent index distribution (birefringence distribution) in the entire surface of the block material in each of Examples 1–4 and Comparative Examples 1, 2 was measured using a birefringent index measuring system employing the phase modulation method. The distribution of birefringences was measured at the pitch of 5 mm in the diameter along two orthogonal directions within the surface of each block material. It was confirmed that the distribution of birefringent indices was rotationally symmetric, because the synthetic glass ingot in each of Examples and Comparative Examples was synthesized while rotating. Therefore, the birefringent index distribution in the block surface can be estimated by the measurement in the diameter along two directions. For each block material, a difference was then calculated between a maximum and a minimum in the radial birefringence distribution measured in this way. The result thereof is presented as a difference of birefringence distribution in Table 2. The difference of birefringence distribution was greater than 2.0 nm/cm in Comparative Examples 1, 2, while it was within 2.0 nm/cm to ensure homogeneity in Examples 1–4.

(Measurement of Hydroxyl Concentration and Hydrogen Molecule Concentration)

The hydroxyl concentrations and the hydrogen molecule concentrations were measured by the laser Raman spectroscopy. Each hydroxyl concentration was calculated based on the intensity ratio of Raman scattered light of 3690 $cm^{-1}$ originating in the vibration of hydroxyl groups to Raman scattered light of 800 $cm^{-1}$ originating in the vibration of the fundamental structure of silica glass. Each hydrogen molecule concentration was calculated based on the intensity ratio of Raman scattered light of 4135 $cm^{-1}$ originating in the vibration of hydrogen molecules to Raman scattered light of 800 $cm^{-1}$. Each hydroxyl concentration distribution was measured at the pitch of 5 mm in the diameter along two orthogonal directions, as in the case of the birefringent index distribution. The hydrogen molecule concentrations were measured around the center of each block (a portion from which a test piece for evaluation of transmittance would be cut out later). It was preliminarily confirmed in the measurement that the distributions of hydroxyl concentrations and hydrogen molecule concentrations were rotationally symmetric, as in the case of the birefringent index distribution. For each block material, a difference was calculated between a maximum and a minimum in the radial hydroxyl concentration distribution measured as described above. The result thereof is presented as a difference of hydroxyl concentration distribution in Table 2. Table 2 also presents the hydroxyl concentration (the concentration near the center of each block material) and hydrogen molecule concentration of each material measured as described above. The hydrogen molecule concentration was not less than $1\times10^{16}$ molecules/cm$^3$ nor more than $5\times10^{18}$ molecules/cm$^3$ in Examples 1–4, whereas it was outside this range in Comparative Examples 1, 2. The hydroxyl concentration was 800–1300 ppm in Examples 1–4 and Comparative Example 2, but it was outside this range in Comparative Example 1. The difference of hydroxyl concentration distribution was as good as 50 ppm or less in Examples 1–4 and Comparative Example 2, whereas in Comparative Example 1 it was greater than 50 ppm to indicate inadequate homogeneity.

(Analysis of Composition SiO$_x$)

In Examples 1–4 and Comparative Examples 1, 2, x in the composition SiO$_x$ was as presented in Table 2. This x was determined by the microgram method. This x was not less than 1.85 nor more than 1.95 in Examples 1–4, but it was outside this range in Comparative Examples 1, 2.

(Measurement 1 of Absorption Coefficient)

Then a test piece of shape with polished surfaces of $\phi$60 mm and in the thickness of 10 mm or a test piece of shape with polished surfaces of 15×15 mm and in the length of 100 mm was cut out one each per ingot from the vicinity of the center of the block material in Examples 1–4 and Comparative Examples 1, 2. These test pieces were used as those for evaluation of transmittance. These test pieces were subjected to such precise polishing that two surfaces facing each other (the surfaces of $\phi$60 mm or the surfaces of 15×15 mm) had the parallelism within ten seconds, the flatness of each surface was within three Newton rings, and the surface roughness rms of each surface was not more than 10 angstroms, and each test piece was finally polished so that the thickness of the test piece became 10±0.1 mm or the length became 100±0.1 mm. Furthermore, each test piece was subjected to finish polishing with high-purity SiO$_2$ powder, in order to prevent an abrasive from remaining on the surface.

Internal loss coefficients in the wavelength region of 190 to 400 nm of the test pieces obtained in this way were measured with a spectrophotometer adjusted by the method as disclosed in Japanese Patent Applications Laid-Open No. 07-63680 and Laid-Open No. 11-211613. An internal absorption coefficient was calculated by subtracting an internal scattering coefficient from an internal scattering coefficient. The internal loss coefficient of the synthetic silica glass at 193.4 nm, which is the lasing wavelength of the ArF excimer laser, was measured as 0.0015 cm$^{-1}$, and the absorption coefficient at 193.4 nm of a test piece is a value obtained by subtracting an internal scattering loss value from the internal loss coefficient. The initial absorption coefficients at 193.4 nm (before the irradiation with the ArF excimer laser) of all the test pieces were not more than 0.003 cm$^{-1}$.

For each test piece, the absorption coefficient of the test piece was then measured while subjecting it to a plurality of repeating units, each unit consisting of an irradiation on stage of irradiation with $1\times10^4$ pulses of the pulse laser light from the ArF excimer laser in the average one-pulse energy density as presented in Table 2, and an irradiation off stage subsequent thereto, for an elapsed time presented in Table 2. Among the results of the measurement, the measurement results in Examples 2, 3 and Comparative Example 1 are presented in FIG. 5. For each test piece, a difference was then calculated between the absorption coefficient immediately before the end of the irradiation on stage and the absorption coefficient at the time of the end of the irradiation off stage in each unit. Table 2 also provides this difference between the absorption coefficients. It is seen that in Examples 1–4 this difference between the absorption coefficients is not more than 0.005 cm$^{-1}$ and the variation amount of absorption coefficient is thus small; whereas in Comparative Examples 1, 2 the difference between the absorption coefficients is greater than 0.005 cm$^{-1}$ and the variation amount of absorption coefficient is thus large.

(Measurement 2 of Absorption Coefficient)

Measurement was carried out to obtain the absorption coefficient A immediately before the end of irradiation of each test piece with $1\times10^4$ pulses of the ArF excimer laser light in the average one-pulse energy density of 2 mJ/cm$^2$, and the absorption coefficient B at 600 seconds after the stop of the irradiation with the ArF excimer laser light, and a difference A−B between them was calculated. The results obtained are presented in Table 3.

(Measurement of Na Concentration)

Each Na concentration was measured in such a way that a sample for analysis of Na was cut out of a portion adjacent to the test piece for evaluation of transmittance in each block material in each of Examples 1–4 and Comparative Examples 1, 2 and the Na concentration was determined by radioactivation analysis based on irradiation with a thermal neutron beam. The Na concentration was lower than 5 ppm in the test pieces of Examples 1–4 and Comparative Example 2, and it was 21 ppm in Comparative Example 1.

TABLE 2

| | | | | | | | | Measurement of absorption coefficient | |
| --- | --- | --- | --- | --- | --- | --- | --- | --- | --- |
| | x in composition SiO$_x$ | H$_2$ conc. [/cm$^3$] | Na conc · [ppm] | Difference of birefringence distribution [ppm] | OH conc. [ppm] | Difference of OH conc. Distribution [nm/cm] | ArF irradiation energy density [mJ/cm$^2$/p] | Elapsed time after irradiation off [sec] | Difference between absorption coefficient immediately before irradiation off and absorption coefficient at elapsed time after irradiation off [cm$^{-1}$] |
| Example 1 | 1.90 | 2.5 × 10$^{18}$ | <5 | 1.1 | 950 | 20 | 50 | 900 | 0.0035 |
| Example 2 | 1.90 | 1.0 × 10$^{16}$ | <5 | 1.9 | 1000 | 20 | 2 | 60 | 0 |
| Example 3 | 1.95 | 7.2 × 10$^{16}$ | <5 | 1.2 | 1115 | 30 | 12 | 180 | 0.002 |
| Example 4 | 1.95 | 6.3 × 10$^{16}$ | <5 | 1.5 | 1120 | 20 | 20 | 600 | 0.0001 |
| Comparative Example 1 | 1.80 | 5.8 × 10$^{18}$ | 21 | 2.8 | 750 | 55 | 2 | 60 | 0.0055 |

TABLE 2-continued

|  | x in composition $SiO_x$ | $H_2$ conc. [/cm$^3$] | Na conc · [ppm] | Difference of birefringence distribution [ppm] | OH conc. [ppm] | Difference of OH conc. Distribution [nm/cm] | ArF irradiation energy density [mJ/cm$^2$/p] | Elapsed time after irradiation off [sec] | Difference between absorption coefficient immediately before irradiation off and absorption coefficient at elapsed time after irradiation off [cm$^{-1}$] |
|---|---|---|---|---|---|---|---|---|---|
| Comparative Example 2 | 2.05 | <1.0 × 10$^{16}$ | <5 | 2.2 | 1250 | 20 | 2 | 60 | 0.0054 |
| Comparative Example 3 | 1.80 | 5.3 | 20 | 2.4 | 550 | 55 | 2 | 600 | 0.0037 |

TABLE 3

| | Measurement 2 of absorption coefficient | | | |
|---|---|---|---|---|
| | Absorption coefficient A [cm$^{-1}$] | Absorption coefficient B [sec] | A − B [cm$^{-1}$] | A/B |
| Example 1 | 0.0040 | 0.0022 | 0.0018 | 1.8 |
| Example 2 | 0.0001 | 0.001 | 0 | 1.0 |
| Example 3 | 0.00038 | 0.00019 | 0.00019 | 2.0 |
| Example 4 | 0.00034 | 0.00021 | 0.00013 | 1.6 |
| Comparative Example 1 | 0.0056 | 0.0018 | 0.0052 | 3.9 |
| Comparative Example 2 | 0.014 | 0.014 | 0 | 1.0 |
| Comparative Example 3 | 0.0053 | 0.0017 | 0.0037 | 3.1 |

Examples 5–12
(Fabrication of Silica Glass Member)

Figure 6:
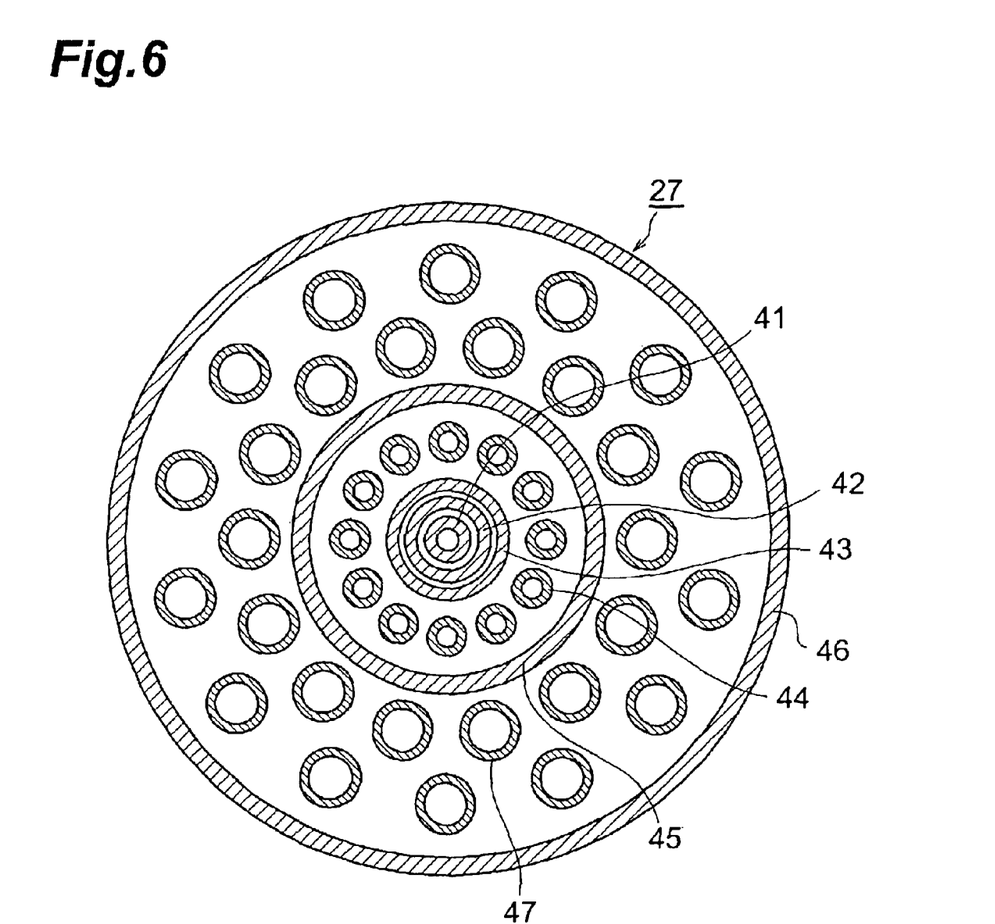
FIG. 6 is an explanatory diagram showing a configuration of a burner used in Examples 5–12.

The silica glasses in Examples 5–12 were fabricated using the synthetic silica glass fabrication system 21 shown in FIG. 3. In Examples 5–12 the silica glasses were fabricated using the burner having the configuration shown in FIG. 6. FIG. 6 is a schematic illustration showing the silica glass synthesis burner 27 viewed from the ejection orifice side. This burner is provided with a first tube 41 placed in the central region and provided for ejecting the source gas and the carrier gas for dilution thereof; a second tube 42 concentrically arranged around the first tube 41; a third tube 43 concentrically arranged around the second tube 42; a fourth tube 44 concentrically arranged around the third tube 43; a plurality of fifth tubes 45 arranged between the outer periphery of the third tube 43 and the inside of the fourth tube 44; a sixth tube 46 concentrically arranged around the fourth tube 44; and a plurality of seventh tubes 47 arranged between the outer periphery of the fourth tube 44 and the inner periphery of the sixth tube 46. The dimensions (mm) of each tube 41–47 were as presented in Table 4 below.

TABLE 4

| | Inside diameter [mm] | Outside diameter [mm] |
|---|---|---|
| First tube 41 | 4.0 | 6.0 |
| Second tube 42 | 7.5 | 10.1 |
| Third tube 43 | 11.5 | 13.9 |
| Fourth tube 44 | 31.5 | 35.5 |
| Fifth tubes 45 | 2.5 | 4.9 |
| Sixth tube 46 | 71.0 | 77.0 |
| Seventh tubes 47 | 4.5 | 6.9 |

When the source gas was a silicon chloride compound or a silicon fluoride compound, gases were ejected from the ejection orifice 27a at the distal end of the burner 27 in such a manner that oxygen gas 1 was ejected from between the first tube 41 and the second tube 42, hydrogen gas 1 from between the second tube 42 and the third tube 43, hydrogen gas 2 from between the third tube 43 and the fourth tube 44, oxygen gas 2 from the plurality of fifth tubes 45, hydrogen gas 3 from between the fourth tube 44 and the sixth tube 46, and oxygen gas 3 from the plurality of seventh tubes 47. When the source gas was an organosilicon compound, gases were ejected from the ejection orifice 27a at the distal end of the burner 27 in such a manner that hydrogen gas 1 was ejected from between the first tube 41 and the second tube 42, oxygen gas 1 from between the second tube 42 and the third tube 43, hydrogen gas 2 from between the third tube 43 and the fourth tube 44, oxygen gas 2 from the plurality of fifth tubes 45, hydrogen gas 3 from between the fourth tube 44 and the sixth tube 46, and oxygen gas 3 from the plurality of seventh tubes 47.

Using this synthetic silica glass fabrication system 21, the oxygen gas and hydrogen gas were ejected from the ejection orifice 27a at the distal end of the burner 27 to be mixed and burnt. At the same time as it, the gas of the silicon chloride compound, the silicon fluoride compound, or the organosilicon compound of high purity (purity: 99.99% or higher, and metal impurities: Fe concentration not more than 10 ppb; Ni and Cr concentrations not more than 2 ppb) as a raw material, as diluted with a carrier gas (oxygen gas of 1.8 slm in the case of the raw material being the silicon chloride compound or the silicon fluoride compound, or nitrogen gas: flow rate 3.5 slm in the case of the raw material being the organosilicon compound), was ejected at the source flow rate of the set flow rate presented in Table 5 below, from the first tube 41 in the center of the burner 27. This resulted in generating silica glass microparticles (soot) by oxidative reaction in the combustion flame, and the microparticles were deposited on the silica glass target 26 and simultaneously fused by heat of the flame, so as to synthesize the synthetic silica glass ingot IG (300–350 mm in diameter and 600–800 mm in length) in each of Examples 1–12 and Comparative Examples 1–4. During this operation, the target 26 was rotated at the rate of seven rotations per minute, was swung within the moving range of 80 mm in the period of 90 seconds, and was pulled down at the down rate as presented in Table 5 below.

Table 5 and Table 6 below present a list of synthesis conditions in the fabrication of the silica glass ingots in Examples 5–12 and Comparative Examples 3, 4. Specifically, Table 5 and Table 6 provide each of setting conditions for the type of the raw material, the flow rate of the raw material, the ingot descent speed, the flow rates of hydrogen gases 1–3, the flow rates of oxygen gases 1–3, the ratio of the ejection flow rate of oxygen gas 1 to the ejection flow rate of hydrogen gas 1 (ratio 1=flow rate of oxygen gas 1/flow rate of hydrogen gas 1), the ratio of the ejection flow rate of oxygen gas 2 to the ejection flow rate of hydrogen gas 2 (ratio 2=flow rate of oxygen gas 2/flow rate of hydrogen gas 2), and the ratio of the ejection flow rate of oxygen gas 3 to the ejection flow rate of hydrogen gas 3 (ratio 3=flow rate of oxygen gas 3/flow rate of hydrogen gas 3) in the fabrication of the silica glass ingots in Examples 5–12 and Comparative Examples 3,4. The hydrogen gases 1–3 and the oxygen gases 1–3 represent the hydrogen gases or the oxygen gases ejected from the respective portions of the ejection orifice 27a of the burner 27 described previously.

TABLE 5

| | Species of raw material | Flow rate of raw material | Descent speed [mm/hr] | Hydrogen gas 1 [slm] | Oxygen gas 1 [slm] | Ratio 1 |
|---|---|---|---|---|---|---|
| Example 5 | SiCl$_4$ | 30.0 g/min | 2.4 | 70 | 21 | 0.30 |
| Example 6 | SiCl$_4$ | 30.0 g/min | 2.4 | 70 | 21 | 0.30 |
| Example 7 | SiF$_4$ | 5.3 slm | 3.3 | 70 | 21 | 0.30 |
| Example 8 | SiF$_4$ | 5.3 slm | 3.3 | 70 | 21 | 0.30 |
| Example 9 | HMDS | 15.7 g/min | 1.6 | 50 | 50 | 1.00 |
| Example 10 | HMDS | 15.7 g/min | 1.6 | 50 | 40 | 0.80 |
| Example 11 | OMCTS | 13.1 g/min | 1.6 | 50 | 43 | 0.86 |
| Example 12 | OMCTS | 13.1 g/min | 1.6 | 50 | 50 | 1.00 |

TABLE 6

| | Hydrogen gas 2 [slm] | Oxygen gas 2 [slm] | Ratio 2 | Hydrogen gas 3 [slm] | Oxygen gas 3 [slm] | Ratio 3 |
|---|---|---|---|---|---|---|
| Example 5 | 150 | 180 | 1.20 | 250 | 110 | 0.44 |
| Example 6 | 150 | 66 | 0.44 | 230 | 101 | 0.44 |
| Example 7 | 150 | 128 | 0.85 | 240 | 106 | 0.44 |
| Example 8 | 150 | 66 | 0.44 | 220 | 97 | 0.44 |
| Example 9 | 120 | 72 | 0.60 | 240 | 106 | 0.44 |
| Example 10 | 120 | 53 | 0.44 | 250 | 110 | 0.44 |
| Example 11 | 120 | 53 | 0.44 | 230 | 101 | 0.44 |
| Example 12 | 120 | 53 | 0.44 | 260 | 114 | 0.44 |

As presented in Table 5, the source gas was silicon tetrachloride (SiCl$_4$) as the silicon chloride compound in Examples 5, 6, silicon tetrafluoride (SiF$_4$) as the silicon fluoride compound in Examples 7, 8, hexamethyldisiloxane [chemical formula: (CH$_3$)$_3$SiOSi(CH$_3$)$_3$, abbreviation: HMDS] as the organosilicon compound in Examples 9, 10, or octamethyl cyclotetrasiloxane [chemical formula: (Si(CH$_3$)$_2$O)$_4$, abbreviation: OMCTS] as the organosilicon compound in Examples 11, 12.

A column-shaped block material 280 mm in diameter and 200 mm in thickness was cut out from the portion located in the radial center region and 100 mm inside from the top surface (ingot head) of each silica glass ingot in Examples 5–12.

The block materials 280 mm in diameter and 200 mm in thickness thus cut out were subjected to an annealing (slow cooling) treatment. Under the same annealing conditions, all the block materials were subjected to the treatment of heating each block material to 1000° C. in air, retaining it for ten hours, thereafter slowly cooling the block material (or decreasing the temperature) at the rate of 10° C./hour to 500° C., and letting it cool at 500° C.

The block materials of Examples 5, 7, 9, and 11 were not subjected to any thermal treatment after the annealing.

The block materials of Examples 6, 8, 10, and 12, after cut out of the respective ingots, were subjected to a thermal treatment at the retention temperature of 800° C. and for the retention time of 500 hours in a nitrogen gas atmosphere in the thermal treatment furnace under the atmospheric pressure and were thereafter further subjected to a thermal treatment at the retention temperature of 450° C. and for the retention time of 720 hours in an atmosphere of hydrogen gas 100% in the thermal treatment furnace under the internal pressure of 6 atm.

(Analysis of Composition SiO$_x$)

For the silica glass members of Examples 5–12, x in the composition SiO$_x$ is presented in Table 7. This x was determined by the microgram method and was in the range of not less than 1.85 nor more than 1.95 in all the examples.

(Measurement of Absorption Coefficient)

Then a test piece of shape with polished surfaces of 15×15 mm and in the length of 100 mm was cut out one each per ingot from the central region of each block material in Examples 5–12. These test pieces were used as those for evaluation of transmittance. These test pieces were subjected to such precise polishing that two surfaces facing each other (the surfaces of 15×15 mm) had the parallelism within ten seconds, the flatness of each surface was within three Newton rings, and the surface roughness rms of each surface was not more than 10 angstroms, and each test piece was finally polished so that the thickness of the test piece became 10±0.1 mm. Furthermore, each test piece was subjected to finish polishing with high-purity SiO$_2$ powder, in order to prevent an abrasive from remaining on the surface.

Internal loss coefficients in the wavelength region of 190 to 400 nm of the test pieces obtained in this way were measured with the spectrophotometer adjusted by the method as disclosed in Japanese Patent Applications Laid-Open No. 07-63680 and Laid-Open No. 11-211613. An internal absorption coefficient was calculated by subtracting an internal scattering coefficient from an internal loss coefficient. The internal loss coefficient of the synthetic silica glass at 193.4 nm, which is the lasing wavelength of the ArF excimer laser, was measured as 0.0015 cm$^{-1}$, and the absorption coefficient at 193.4 nm of a test piece is a value obtained by subtracting an internal scattering loss value from the internal loss coefficient. The initial absorption coefficients at 193.4 nm (before the photoirradiation) of all the test pieces were not more than 0.001 cm$^{-1}$.

Then each test piece was exposed to the pulse laser light from the ArF excimer laser and measurement was conducted to obtain the in-irradiation absorption coefficient A generated by the irradiation, and the absorption coefficient B at 600 seconds after the stop of the irradiation. The irradiation conditions with the ArF excimer laser were the average one-pulse energy density: 2 mJ/cm$^2$ and the number of irradiated pulses: 1×10$^5$ pulses. The difference A−B and the ratio A/B were calculated from the measured absorption coefficients A, B. The results obtained are presented in Table 7.

Figure 7:
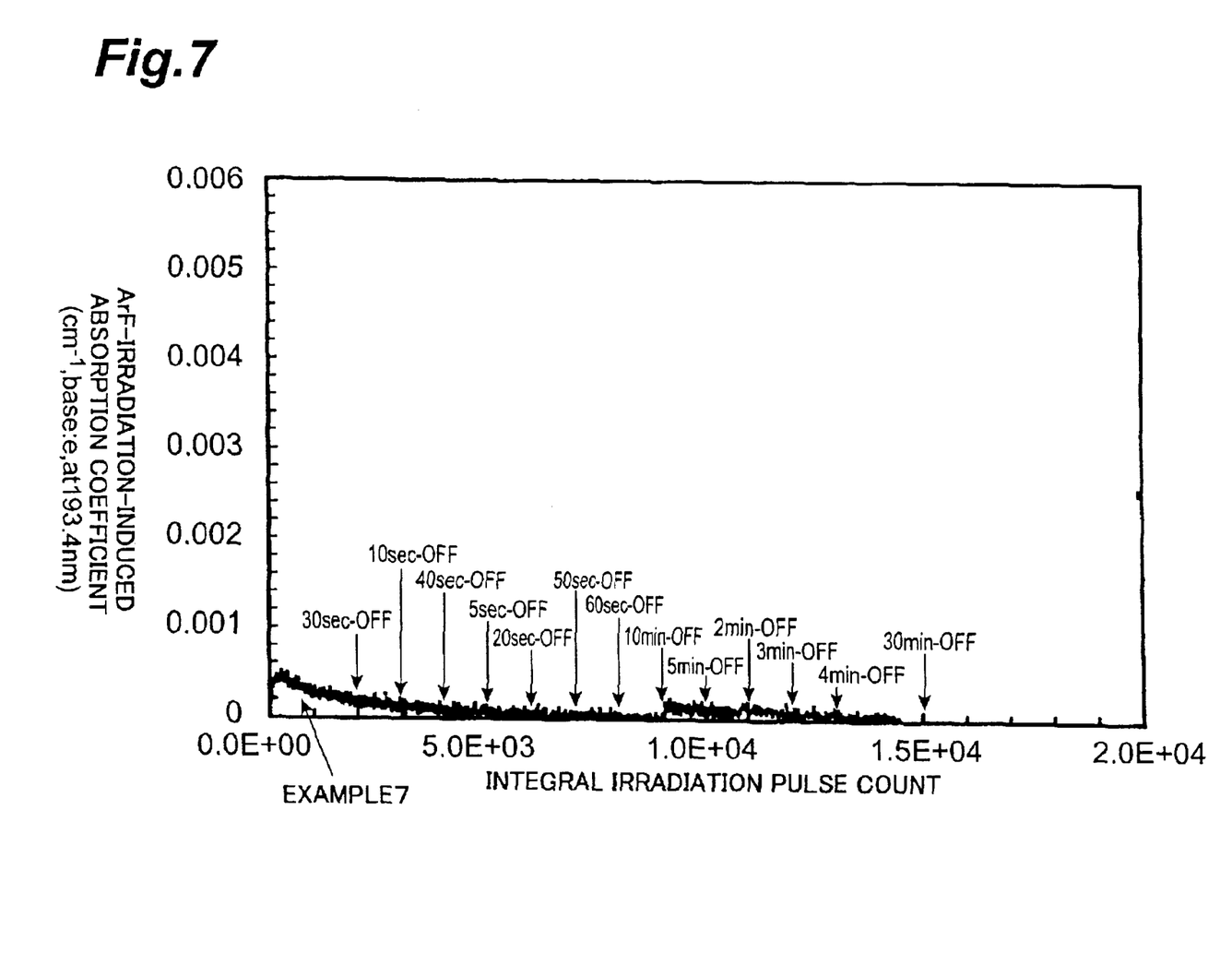
FIG. 7 is a graph showing the absorption coefficients in repetitions of irradiation on and irradiation off with the ArF excimer laser in Example 7.

The absorption coefficient was measured with the silica glass member obtained in Example 7 in repetitions of irradiation on and irradiation off with the ArF excimer laser under the irradiation condition of the average one-pulse energy density of 2 mJ/cm$^2$. The measurement result is presented in FIG. 7. In FIG. 7, arrows are given to irradiation integral pulse counts at offs of irradiation and irradiation off durations in the respective offs are also given. In the drawing, for example, "1.0E+05" means 1.0×10$^6$.

As seen from FIG. 7, it was verified that the variation of absorption coefficient was small in the silica glass member of Example 7 even in a plurality of repetitions of irradiation on and irradiation off with the ArF excimer laser.

analysis of alkaline earth metals, transition metals, and Al was cut out from a place adjacent to the sample for analysis of Cl, Na, and K in each block material in Examples 5–12 and Comparative Examples 3, 4. The quantity of each element was determined by inductively coupled plasma emission spectrometry. The Na concentrations of all the test pieces were not more than 0.001 ppm, and it was thus verified that Na exercised no influence on absorption loss at 193.4 nm. Furthermore, the chlorine concentration was 20–60 ppm in the test pieces of Examples 5, 7 synthesized using the raw material of silicon tetrachloride. The chlorine concentration was below the minimum limit of detection (0.1 ppm) in all the test pieces of Examples 6, and 8–12 and Comparative Examples 3, 4 synthesized from the raw material of silicon tetrafluoride or organosilicon. Furthermore, the K concentration was below the minimum limit of detection (50 ppb) in all the samples of Examples 5–12 and Comparative Examples 3, 4. Concentrations of respective elements of alkaline earth metals Mg and Ca, transition metals Sc, Ti, V, Cr, Mn, Fe, Co, Ni, Cu, and Zn, and Al were not more than 20 ppb in all the samples of Examples 5–12.

TABLE 7

| | x in composition SiO$_x$ | OH conc [ppm] | H$_2$ conc [molecules/cm$^3$] | Absorption coefficient A [cm$^{-1}$] | Absorption coefficient B [cm$^{-1}$] | A − B [cm$^{-1}$] | A/B |
|---|---|---|---|---|---|---|---|
| Example 5 | 1.95 | 1200 | 1.5 × 10$^{17}$ | 0.0010 | 0.0007 | 0.0003 | 1.4 |
| Example 6 | 1.95 | 950 | 2.2 × 10$^{18}$ | 0.0001 | 0.0001 | 0 | 1.0 |
| Example 7 | 1.95 | 1000 | 2.0 × 10$^{17}$ | 0.0003 | 0.00025 | 0.00005 | 1.2 |
| Example 8 | 1.95 | 950 | 2.2 × 10$^{18}$ | 0.0001 | 0.0001 | 0 | 1.0 |
| Example 9 | 1.95 | 1250 | 1.2 × 10$^{17}$ | 0.0002 | 0.00018 | 0.00002 | 1.1 |
| Example 10 | 1.95 | 1050 | 2.3 × 10$^{18}$ | 0.0001 | 0.0001 | 0 | 1.0 |
| Example 11 | 1.95 | 780 | 3.6 × 10$^{17}$ | 0.0025 | 0.0015 | 0.0010 | 1.7 |
| Example 12 | 1.95 | 950 | 2.3 × 10$^{18}$ | 0.0001 | 0.0001 | 0 | 1.0 |

(Measurement of Hydrogen Molecule Concentration and Hydroxyl Concentration)

The measurement of hydrogen molecule concentration and hydroxyl concentration will be described below. The measurement of these was carried out using the laser Raman spectrophotometer. The argon ion laser of the wavelength of 488 nm (power 400 mW) was injected into each test piece, the intensity was measured at 800 cm$^{-1}$ (a peak originating in the vibration of the fundamental structure of silica glass: reference light), at 4135 cm$^{-1}$ (a peak originating in the vibration of hydrogen molecules), and at 3690 cm$^{-1}$ (a peak originating in the vibration of hydroxyl groups) out of Raman scattered light radiated in the direction perpendicular to the direction of incident light, and the hydrogen molecule concentration and the hydroxyl concentration were determined based on intensity ratios thereof. The measurement results of those are also presented in Table 7.

(Measurement of Impurity Concentrations)

A sample for analysis of Cl, Na, and K in 10 mm×10 mm×5 mm was cut out from a portion adjacent to the test piece for evaluation of transmittance in each block material in Examples 5–12. Concentrations of these impurities were determined by radioactivation analysis based on irradiation with a thermal neutron beam. A sample for elementary (Fabrication of Projection Optical System and Projection Exposure Apparatus)

A projection lens for exposure apparatus with the ArF excimer laser as a light source was fabricated using a plurality of silica glass members of Example 2 and a projection optical system was assembled using it. The projection optical system obtained achieved the resolution of 0.19 μm or lower in the line-and-space image. When this projection lens was mounted on the exposure apparatus, there appeared no illuminance variation in the exposure area on the silicon wafer, so as to enable uniform exposure, thereby achieving the excellent imaging performance as an ArF excimer laser stepper. Much the same results were also achieved in the cases using the silica glass members of Examples 1, and 3–12.

On the other hand, when the projection lens for the exposure apparatus with the ArF excimer laser as a light source was fabricated using a plurality of synthetic silica glass members of Comparative Example 2 and the projection optical system was assembled using it, the exposure apparatus equipped with the projection optical system gave rise to the illuminance variation in the exposure area on the silicon wafer and failed to implement uniform exposure.

(Fabrication of Illumination Optical System and Evaluation of Illuminance Variation)

For fabricating the illumination optical system consisting of an ArF beam laser introducing section, a beam shaping optical system, and a relay lens, the silica glass member of Example 2 was applied to all the silica glass members in the relay lens group (which was entirely composed of silica glass members and which had the total path length: 400 mm) exercising the greatest influence on the illuminance variation on the reticle surface in the above configuration.

The illumination optical system obtained was evaluated as to the illuminance variation with the ArF excimer laser as a light source, and the illuminance variation rate was approximately 0.5%. The illuminance variation rate stated herein refers to a value of illuminance variation on the reticle surface which is expressed by a ratio of illuminance during an irradiation on period with the laser to illuminance during an irradiation off period. Much the same effect was also confirmed in the projection optical system.

Another illumination optical system was fabricated in much the same manner as the above except that the silica glass member of Comparative Example 3 was used instead of the silica glass member of Example 2, and was evaluated as to the illuminance variation. The result thereof was that the illuminance variation rate was approximately 4%.

It is noted that the present invention is by no means intended to be limited to the above embodiments and examples. For example, the silica glass member of the present invention can also be applied to apparatus such as processing apparatus, measuring apparatus, etc. using the short-wavelength lasers except for the projection exposure apparatus.

INDUSTRIAL APPLICABILITY

As described above, the silica glass member and projection exposure apparatus of the present invention are able to prevent the absorption of ultraviolet light in the illumination optical system and the projection optical system and implement the high-resolution and uniform exposure while reducing the illuminance variation on the reticle surface and in the exposure area on the wafer.

What is claimed is:

1. A silica glass member wherein when a composition thereof is expressed by $SiO_x$, x is not less than 1.85 nor more than 1.95, wherein a concentration of hydrogen molecules included therein is not less than $1 \times 10^{16}$ molecules/cm$^3$ nor more than $5 \times 10^{18}$ molecules/cm$^3$, and wherein a difference A–B between an absorption coefficient A immediately before an end of irradiation with $1 \times 10^4$ pulses of ArF excimer laser light in an average one-pulse energy density of 2 mJ/cm$^2$ and an absorption coefficient B at 600 seconds after a stop of the irradiation with the ArF excimer laser light is not more than 0.005 cm$^{-1}$.

2. The silica glass member according to claim 1, wherein the absorption coefficient A and the absorption coefficient B satisfy a condition represented by A/B<2.

3. The silica glass member according to claim 1, wherein an absorption coefficient at a predetermined wavelength in a wavelength region of 190 to 400 nm before the irradiation with the ArF excimer laser light is not more than 0.003 cm$^{-1}$.

4. The silica glass member according to claim 1, wherein in a radial distribution of birefringences a difference between a maximum and a minimum of the birefringences is not more than 2.0 nm/cm.

5. The silica glass member according to claim 1, wherein a hydroxyl concentration is not less than 800 ppm nor more than 1300 ppm and wherein in a radial distribution of hydroxyl concentrations a difference between a maximum and a minimum of the hydroxyl concentrations is not more than 50 ppm.

6. The silica glass member according to claim 1, wherein a content of Na is not more than 20 ppb.

7. A projection exposure apparatus comprising a reticle having a pattern; an illumination optical system for illuminating said reticle with light of a predetermined wavelength; and a projection optical system for focusing the pattern on the reticle illuminated by said illumination optical system, on a wafer, wherein at least either said illumination optical system or said projection optical system comprises a silica glass member wherein when a composition thereof is expressed by $SiO_x$, x is not less than 1.85 nor more than 1.95, wherein a concentration of hydrogen molecules included therein is not less than $1 \times 10^{16}$ molecules/cm$^3$ nor more than $5 \times 10^{18}$ molecules/cm$^3$, and wherein a difference A–B between an absorption coefficient A immediately before an end of irradiation with $1 \times 10^4$ pulses of ArF excimer laser light in an average one-pulse energy density of 2 mJ/cm$^2$ and an absorption coefficient B at ten minutes after a stop of the irradiation with the ArF excimer laser light is not more than 0.005 cm$^{-1}$.

* * * * *